United States Patent
Eum et al.

(10) Patent No.: US 9,113,585 B2
(45) Date of Patent: Aug. 18, 2015

(54) METHOD OF FORMING EXTERNAL TERMINALS OF A PACKAGE AND APPARATUS FOR PERFORMING THE SAME

(71) Applicant: Samsung Electronics Co., Ltd, Suwon-si, Gyeonggi-do (KR)

(72) Inventors: Yo-Se Eum, Cheonan-si (KR); Sang-Geun Kim, Cheonan-si (KR); Seok-Yong Lee, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/171,992

(22) Filed: Feb. 4, 2014

(65) Prior Publication Data

US 2014/0220774 A1     Aug. 7, 2014

(30) Foreign Application Priority Data

Feb. 4, 2013   (KR) .................. 10-2013-0012133

(51) Int. Cl.

| | |
|---|---|
| H01L 21/44 | (2006.01) |
| H01L 21/683 | (2006.01) |
| H05K 3/34 | (2006.01) |
| H01L 21/48 | (2006.01) |
| H01L 23/00 | (2006.01) |
| B23K 1/00 | (2006.01) |
| B23K 3/06 | (2006.01) |
| B23K 3/08 | (2006.01) |

(52) U.S. Cl.
CPC ............ *H05K 3/3478* (2013.01); *B23K 1/0016* (2013.01); *B23K 3/0623* (2013.01); *B23K 3/08* (2013.01); *H01L 21/4853* (2013.01); *H01L 21/6838* (2013.01); *H01L 24/11* (2013.01); *B23K 2201/42* (2013.01); *H01L 2924/0002* (2013.01); *H05K 2203/041* (2013.01); *Y10T 29/41* (2015.01)

(58) Field of Classification Search
CPC .. H05K 3/0079; H01L 24/11; H01L 21/6838; H01L 21/4853
See application file for complete search history.

(56) References Cited

U.S. PATENT DOCUMENTS

| | | | |
|---|---|---|---|
| 7,546,941 B2 | 6/2009 | No et al. | |
| 7,820,479 B2 | 10/2010 | Sakaguchi | |
| 7,854,366 B2 | 12/2010 | Sakaguchi et al. | |
| 7,854,367 B2 | 12/2010 | Sakaguchi et al. | |
| 7,882,625 B2 | 2/2011 | Aoya | |
| 8,870,051 B2 * | 10/2014 | Brofman et al. | 228/5.5 |
| 2010/0163605 A1 | 7/2010 | Tsai | |
| 2012/0080505 A1 | 4/2012 | Sawa et al. | |

FOREIGN PATENT DOCUMENTS

| | | |
|---|---|---|
| JP | 10-126046 | 5/1998 |
| JP | 2003-298225 | 10/2003 |

(Continued)

*Primary Examiner* — Evan Pert
(74) *Attorney, Agent, or Firm* — Ellsworth IP Group PLLC

(57) ABSTRACT

A method of forming external terminals of a package is provided in which a package substrate may be fixed, an edge portion of the package substrate may be supported to prevent the edge portion of the package substrate from being upwardly bent, a mask having openings may be arranged on the package substrate, and the external terminals may be supplied to the package substrate through the openings of the mask. The supporting portion may downwardly press the edge portion of the package substrate so that the edge portion of the package substrate may not be upwardly bent. As a result, the external terminals on the package substrate may have a uniform thickness.

19 Claims, 4 Drawing Sheets

(56) References Cited

FOREIGN PATENT DOCUMENTS

| | | |
|---|---|---|
| JP | 2006-156434 | 6/2006 |
| JP | 2009-182106 | 8/2009 |
| KR | 10-2002-0068568 | 8/2002 |
| KR | 10-2010-0075715 | 7/2010 |
| KR | 10-2010-0137785 | 12/2010 |
| KR | 10-2012-0050288 | 5/2012 |

* cited by examiner

METHOD OF FORMING EXTERNAL TERMINALS OF A PACKAGE AND APPARATUS FOR PERFORMING THE SAME

CROSS-REFERENCE TO RELATED APPLICATIONS

This application claims the benefit of priority under 35 U.S.C. §119 to Korean Patent Application No. 2013-12133, filed on Feb. 4, 2013, in the Korean Intellectual Property Office (KIPO), the content of which is incorporated herein in its entirety by reference.

BACKGROUND

1. Field

An embodiment of the inventive concepts described herein relates to a method of forming external terminals of a package and an apparatus configured to perform the same. More particularly, an example embodiment relates to a method of forming solder balls on a package substrate of a semiconductor package, and an apparatus configured to perform the method.

2. Description of the Related Art

Generally, various semiconductor fabrication processes may be formed on a wafer for a plurality of semiconductor chips. In order to mount the semiconductor chips on a printed circuit board (PCB), a packaging process may be performed on a semiconductor chip to form a semiconductor package.

The semiconductor package may include a package substrate, a semiconductor chip, conductive connecting members, a molding member and external terminals. The semiconductor chip may be arranged on an upper surface of the package substrate. The conductive connecting members may electrically connect the semiconductor chip with the package substrate. The molding member may be formed on the upper surface of the package substrate to cover the semiconductor chip. The external terminals may be mounted on a lower surface of the package substrate.

According to related arts for forming the external terminals, the package substrate may be adhered to a jig using a vacuum. A mask having a plurality of openings may be arranged on the package substrate. The external terminals, such as solder balls, may be supplied to the package substrate through the plurality of openings of the mask.

The jig may be configured to fix only a central portion of the package substrate using the vacuum. Thus, an edge portion of the package substrate may not be firmly secured. This may result in upwardly protruding edge portion of the package substrate. Therefore, a portion of the mask that makes contact with the upwardly bent edge portion of the package substrate may also be upwardly bent. A solder ball passing through an opening of the upwardly bent portion of the mask may have a thickness greater than that of a solder ball passing through an opening of other portions of the mask. As a result, the solder balls on the package substrate may not have uniform thickness.

SUMMARY

The present general inventive concept provides a method of forming external terminals of a package that may be configured to provide external terminals with uniform thickness.

The present general inventive concept also provides an apparatus configured to perform the above-mentioned method.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a method of forming external terminals of a package in which a package substrate may be fixed, an edge portion of the package substrate may be supported to prevent the edge portion of the package substrate from being upwardly bent, a mask having openings may be arranged on the package substrate, and the external terminals may be supplied to the package substrate through the plurality of openings of the mask.

In an example embodiment, the fixing the package substrate may include applying a vacuum to the package substrate.

In an example embodiment, the supporting the edge portion of the package substrate may include downwardly pressing the edge portion of the package substrate.

In an example embodiment, the providing the external terminals to the package substrate includes providing the external terminals to the package substrate by a printing process.

The foregoing and/or other features and utilities of the present inventive concept also provide an apparatus configured to form external terminals of a package including a jig configured to fix a package substrate, and a fixing block configured to fix an edge portion of a mask, which is configured to be arranged on the package substrate to form the external terminals, the fixing block having a supporting portion that is configured to support an edge portion of the package substrate to prevent the edge portion of the package substrate from being upwardly bent.

In an example embodiment, the supporting portion may be protruded from an inner surface of the fixing block and configured to downwardly press the edge portion of the package substrate.

In an example embodiment, the supporting portion may have a tapered lower surface configured to make contact with an upper surface of the edge portion of the package substrate.

In an example embodiment, the supporting portion may have a rounded lower end configured to make contact with an upper surface of the edge portion of the package substrate.

In an example embodiment, the fixing block may include a pair of blocks, wherein a first block of the pair of blocks is disposed at a first side of the jig and a second block of the pair of blocks is disposed at a second side of the jig.

In an example embodiment, the jig may have a plurality of vacuum holes configured to have a vacuum applied to the package substrate In an example embodiment, the apparatus may further include a lifter configured to lift the jig.

In an example embodiment, the apparatus may further include a rail arranged between the jig and the fixing block and configured to transfer the package substrate.

According to an example embodiment, the supporting portion may be configured to downwardly press the edge portion of the package substrate so that the edge portion of the package substrate may not be upwardly bent. Thus, a portion of the mask that makes contact with the edge portion of the package substrate may also not be upwardly bent. As a result, the external terminals on the package substrate may have uniform thickness.

The foregoing and/or other features and utilities of the present inventive concept also provide an apparatus including a jig configured to apply a force to fix a central portion of a work item, and a first member configured to fix an edge portion of the work item to prevent the edge portion of the work item from bending due to the force.

In an embodiment, the apparatus may also include a second member disposed to prevent the jig from fixing the edge portion.

In an embodiment, the apparatus may also include an elevator configured to raise the jig.

In an embodiment, the work item may be a substrate of a package for an integrated circuit.

In an embodiment, the jig may include holes and the force may be a vacuum.

In an embodiment, the first member may be further configured to support a mask.

In an embodiment, the mask may have openings configured to support an application of a material to the work item to form external electrical connections for the work item.

In an embodiment, the first member may have a surface with an end configured to make point contact with the edge portion.

In an embodiment, the surface may be substantially flat and the end may be substantially angular.

In an embodiment, the surface may be substantially flat and the end may be substantially rounded.

In an embodiment, the surface may be substantially tapered and the end may be substantially angular.

In an embodiment, the surface may be substantially tapered and the end may be substantially rounded.

BRIEF DESCRIPTION OF THE DRAWINGS

These and/or other features and utilities will become more apparent and more readily appreciated from the following description of the embodiments, taken in conjunction with the accompanying drawings of which.

DETAILED DESCRIPTION OF THE EMBODIMENTS

Figure 1:
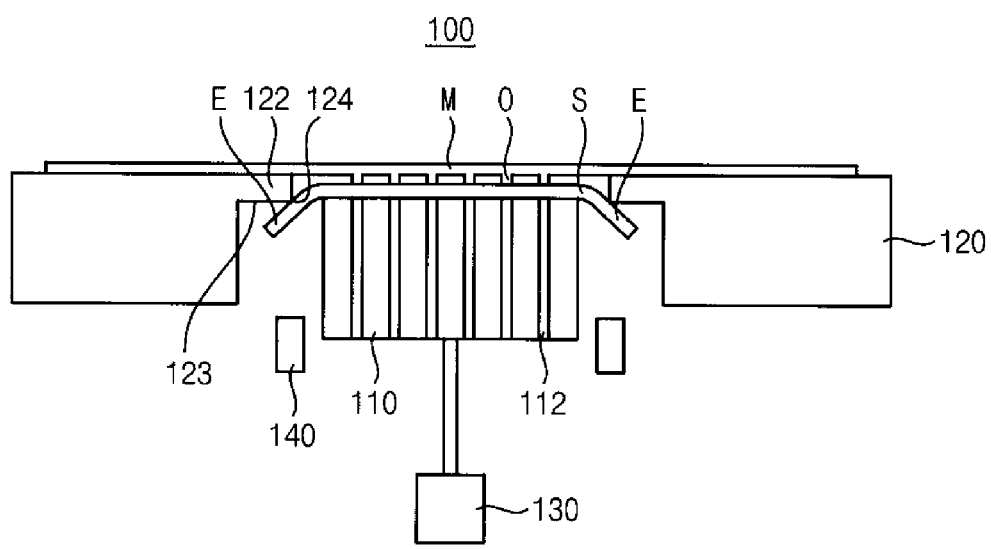
FIG. 1 is a cross-sectional view illustrating an example of an apparatus configured to form external terminals of a package according to an embodiment of the inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

The present general inventive concept may, however, be embodied in many different forms and should not be construed as limited to the example embodiments set forth herein. Rather, these example embodiments are provided so that this disclosure will be thorough and complete, and will fully convey the scope of the present general inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a cross-sectional view illustrating an example of an apparatus 100 configured to form external terminals of a package according to an embodiment of the inventive concept.

Referring to FIG. 1, the apparatus 100 configured to form external terminals in accordance with this example embodiment may include a jig 110, a pair of fixing blocks 120, a lifter 130 and a rail 140.

The jig 110 may be configured to fix a package substrate S of the package. In an example embodiment, the jig 110 may have a plurality of vacuum holes 112. A vacuum may be applied to the package substrate S through the vacuum holes 112 to fix the package substrate S to the jig 110. The jig 110 may fix a central portion of a lower surface of the package substrate S. Thus, an edge portion E of the package substrate S may not be fixed.

The rail 140 may be arranged at both sides of the jig 110. The rail 140 may transfer the package substrate S to the jig 110. In an example embodiment, because the rail 140 configured to transfer the package substrate S may be positioned at both sides of the jig 110, the jig 110 may not fix the edge portion E of the package substrate S.

The lifter 130 may be arranged under the jig 110. The lifter may lift the jig 110. When the package substrate S may be transferred to the jig 110 along the rail 140, the lifter 130 may upwardly move the jig 110.

The pair of the fixing blocks 120 may be arranged at the both sides of the jig 110. The rail 140 may be positioned between the fixing block 120 and the jig 110. The fixing block 120 may have an inner surface oriented toward the jig 110, and an outer surface oriented away from the jig 110. The fixing block 120 may fix both edge portions of a mask M. In an example embodiment, the fixing block 120 may have a flat upper surface that makes contact with a lower surface of the mask M.

In an example embodiment, the mask M may have a plurality of openings O through which the external terminals, such as solder balls, may pass. Further, the mask M may have a gap-providing portion (not illustrated) configured to provide the external terminals on the package substrate S with a uniform thickness. The gap-providing portion (not illustrated) may be configured to make contact with an upper surface of the package substrate S to form a uniform gap between the mask M and the package substrate S, thereby providing the external terminals on the package substrate S with the uniform thickness.

The fixing block 120 may have a supporting portion 122. The supporting portion 122 may prevent the edge portion E of the package substrate S on the jig 110 from being upwardly bent. The edge portion E of the package substrate S may not be upwardly protruded by the supporting portion 122 so that a portion of the mask M making contact with the edge portion E of the package substrate S may also not be protruded upwardly. Thus, the mask M may have a flat shape without an upwardly protruded portion. As a result, the gap between the mask M and the package substrate S may be uniform so that the external terminals on the package substrate S may also have uniform thickness.

In an example embodiment, the supporting portion 122 may be protruded horizontally from an upper inner surface of the fixing block 120. The supporting portion 122 may have a flat lower surface 123. Further, the supporting portion 122 may have an angular lower end 124. The angular lower end 124 of the supporting portion 122 may make point-contact with an upper surface of the edge portion of the package substrate S. The angular lower end 124 of the supporting portion 122 may downwardly press the upper surface of the edge portion E of the package substrate S to prevent the edge portion E of the package substrate from being upwardly bent. The edge portion E of the package substrate S pressed downwardly by the supporting portion 122 may have a slightly downwardly inclined shape.

Figure 2:
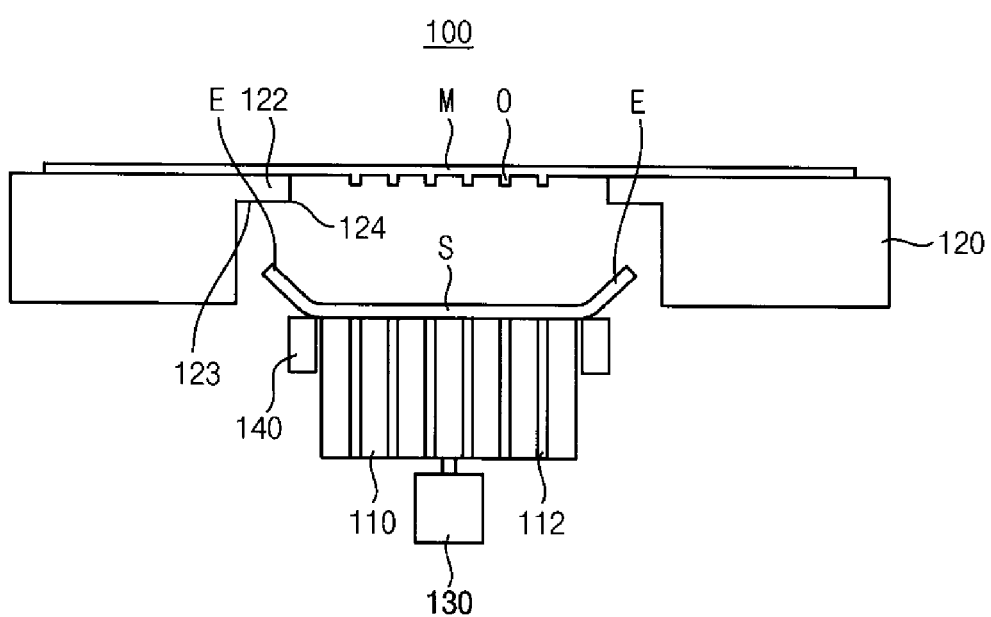
FIGS. 2 to 4 are cross-sectional views illustrating an example of a method of forming external terminals of a package using the apparatus in FIG. 1.
Figure 3:
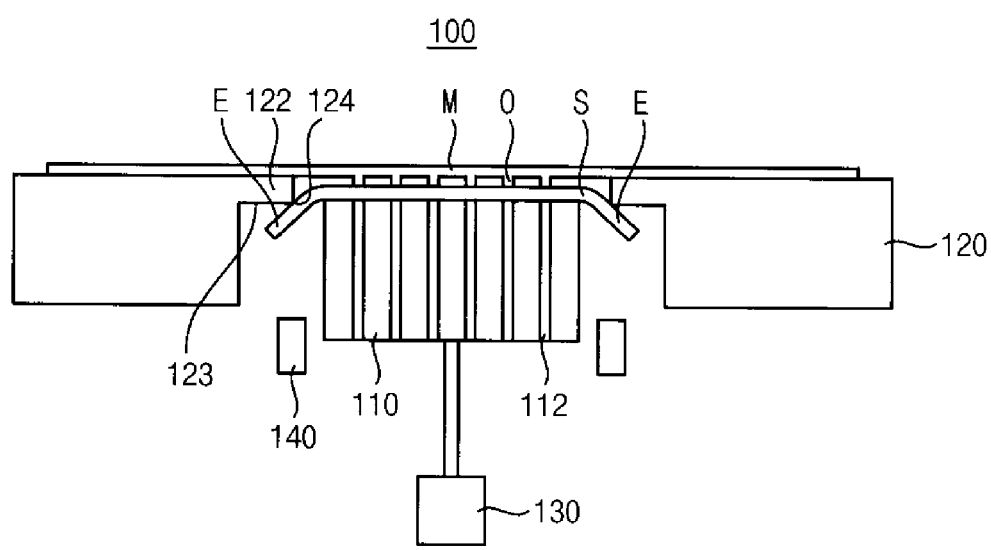
Figure 4:
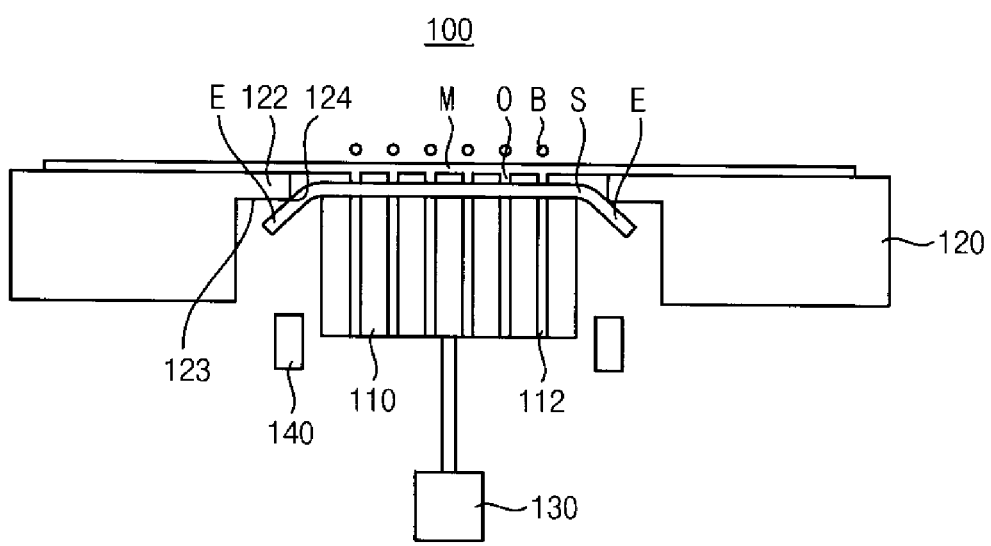

FIGS. 2 to 4 are cross-sectional views illustrating an example of a method of forming external terminals of a package using the apparatus in FIG. 1.

Referring to FIG. 2, the mask M may be fixed to the fixing block 120. The package substrate S may be transferred to the jig 110 by the rail 140.

The vacuum may be applied to the package substrate S on the jig 110 through the vacuum holes 112 to fix the package substrate S to the jig 110. In an example embodiment, the vacuum may be applied to the central portion of the lower surface of the package substrate S. Thus, the edge portion E of the package substrate S having a thin thickness may be bent upwardly.

Referring to FIG. 3, the lifter 130 may upwardly move the jig 110. The package substrate S may be moved upwardly together with the jig 110. The package substrate S may make contact with the gap-providing portion (not illustrated) on the lower surface of the mask M.

In an example embodiment, the supporting portion 122 of the fixing block 120 may downwardly press the edge portion E of the upwardly bent edge portion E of the package substrate S. Therefore, the edge portion E of the package substrate S may not be protruded upwardly.

Referring to FIG. 4, the solder balls B may be supplied to the package substrate S through the openings O of the mask M. In an example embodiment, because the supporting portion 122 may prevent the edge portion E of the package substrate S from being bent upwardly, the gap between the mask M and the package substrate S may be uniformly maintained. Thus, the solder balls B on the package substrate S may also have a uniform thickness. As a result, electrical connection reliability between the solder balls B and a main board may be improved.

Figure 5:
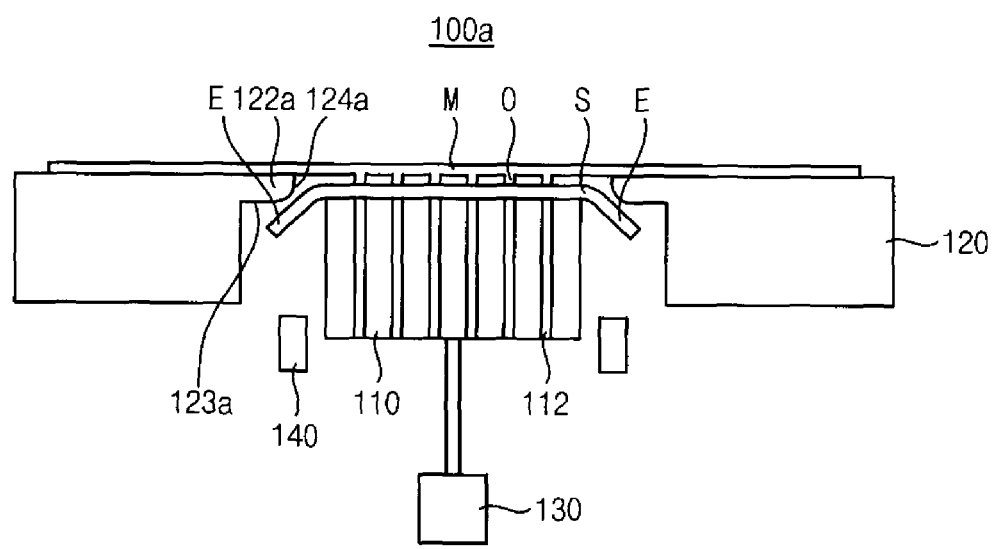
FIG. 5 is a cross-sectional view illustrating an example of an apparatus configured to form external terminals of a package according to an embodiment of the inventive concept.

FIG. 5 is a cross-sectional view illustrating an example of an apparatus configured to form external terminals of a package according to an embodiment of the inventive concept.

In an example embodiment, an apparatus 100a may include elements substantially the same as those of the apparatus 100 in FIG. 1 except for a supporting portion. Thus, the same reference numerals may refer to the same elements and any further explanations with respect to the same elements may be omitted herein for brevity.

Referring to FIG. 5, a supporting portion 122a of an example embodiment may have a flat lower surface 123a and a rounded lower end 124a. Because the upwardly bent edge portion E of the package substrate S may make contact with the rounded lower end 124a, the edge portion E of the package substrate S may not be damaged.

In an example embodiment, a method of forming external terminals of a package using the apparatus 100a may include processes substantially the same as those illustrated with reference to FIGS. 2 to 4. Thus, any further explanations with respect to the method of using the apparatus 100a may be omitted herein for brevity.

Figure 6:
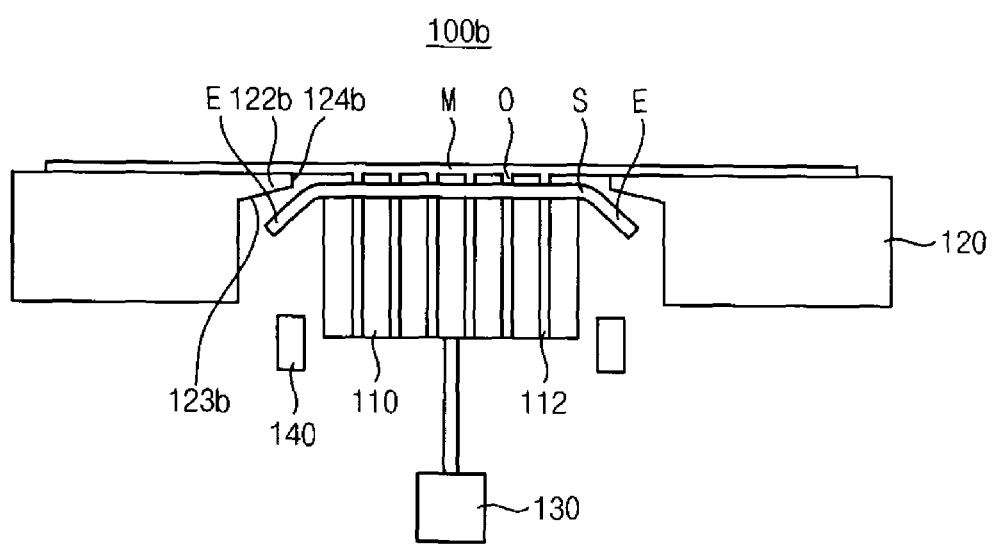
FIG. 6 is a cross-sectional view illustrating an example of an apparatus configured to form external terminals of a package according to an embodiment of the inventive concept.

FIG. 6 is a cross-sectional view illustrating an example of an apparatus configured to form external terminals of a package according to an embodiment of the inventive concept.

An apparatus 100b of an example embodiment may include elements substantially the same as those of the apparatus 100 in FIG. 1 except for a supporting portion. Thus, the same reference numerals may refer to the same elements and any further explanations with respect to the same elements may be omitted herein for brevity.

Referring to FIG. 6, a supporting portion 122b of an example embodiment may have a tapered lower surface 123b and an angular lower end 124b. The tapered lower surface 123b may wholly make contact with the upwardly bent upper surface of the edge portion E of the package substrate S. That is, the tapered lower surface 123b may make surface contact with the upper surface of the edge portion E of the package substrate S. Therefore, scratches caused by contacts between the supporting portion 122b and the edge portion E of the package substrate S may be reduced.

In an example embodiment, a method of forming external terminals of a package using the apparatus 100b may include processes substantially the same as those illustrated with reference to FIGS. 2 to 4. Thus, any further explanations with respect to the method of using the apparatus 100b may be omitted herein for brevity.

Figure 7:
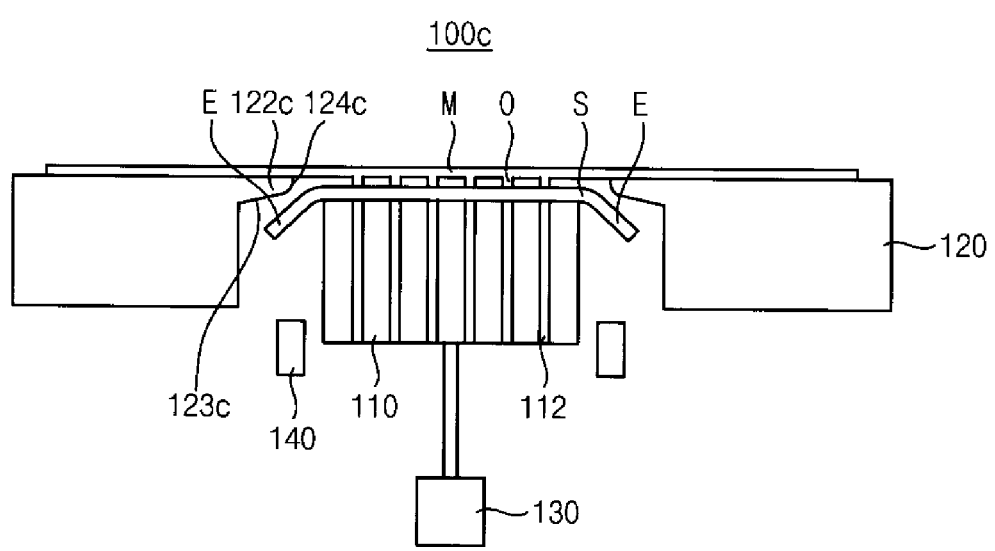
FIG. 7 is a cross-sectional view illustrating example of an apparatus configured to form external terminals of a package according to an embodiment of the inventive concept.

FIG. 7 is a cross-sectional view illustrating an example of an apparatus configured to form external terminals of a package according to an embodiment of the inventive concept.

An apparatus 100c of an example embodiment may include elements substantially the same as those of the apparatus 100 in FIG. 1 except for a supporting portion. Thus, the same reference numerals may refer to the same elements and any further explanations with respect to the same elements may be omitted herein for brevity.

Referring to FIG. 7, a supporting portion 122c of this example embodiment may have a tapered lower surface 123c and a rounded lower end 124c. The tapered lower surface 123c may function substantially the same as that of the tapered lower surface 123b in FIG. 6. The rounded lower end 124c may function substantially the same as that of the rounded lower end 124a in FIG. 5.

In an example embodiment, a method of forming external terminals of a package using the apparatus 100c may include processes substantially the same as those illustrated with reference to FIGS. 2 to 4. Thus, any further explanations with respect to the method of using the apparatus 100c may be omitted herein for brevity.

According to an example embodiment, the supporting portion 122c may downwardly press the edge portion E of the package substrate S so that the edge portion E of the package substrate S may not be upwardly bent. Thus, a portion of the mask M that makes contact with the edge portion E of the package substrate S may also not be upwardly bent. As a result, the external terminals on the package substrate S may have uniform thickness.

The foregoing is illustrative of example embodiments and is not to be construed as limiting thereof. Although a few example embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of forming external terminals of a package, the method comprising:
   fixing a package substrate of the package;
   supporting an edge portion of the package substrate to prevent the edge portion of the package substrate from being upwardly bent;
   arranging a mask having a plurality of openings on the package substrate; and
   providing the external terminals to the package substrate through the plurality of openings of the mask.

2. The method of claim 1, wherein the fixing the package substrate comprises applying a vacuum to the package substrate.

3. The method of claim 1, wherein the supporting the edge portion of the package substrate comprises downwardly pressing the edge portion of the package substrate.

4. The method of claim 1, wherein the providing the external terminals to the package substrate comprises providing the external terminals to the package substrate by a printing process.

5. An apparatus configured to form external terminals of a package, the apparatus comprising:
   a jig configured to fix a package substrate of the package; and
   a fixing block configured to fix an edge portion of a mask, which is configured to be arranged on the package substrate to form the external terminals, the fixing block having a supporting portion that is configured to support an edge portion of the package substrate to prevent the edge portion of the package substrate from being upwardly bent.

6. The apparatus of claim 5, wherein the supporting portion is protruded from an inner surface of the fixing block and configured to downwardly press the edge portion of the package substrate.

7. The apparatus of claim 6, wherein the supporting portion has a tapered lower surface configured to make contact with an upper surface of the edge portion of the package substrate.

8. The apparatus of claim 6, wherein the supporting portion has a rounded lower end configured to make contact with an upper surface of the edge portion of the package substrate.

9. The apparatus of claim 5, wherein the fixing block comprises a pair of blocks, wherein a first block of the pair of blocks is disposed at a first side of the jig and a second block of the pair of blocks is disposed at a second side of the jig.

10. The apparatus of claim 5, wherein the jig has a plurality of vacuum holes configured to have a vacuum applied to the package substrate.

11. The apparatus of claim 5, further comprising a lifter configured to lift the jig.

12. The apparatus of claim 5, further comprising a rail arranged between the jig and the fixing block and configured to transfer the package substrate.

13. An apparatus, comprising:
   a jig configured to apply a force to fix a central portion of a work item; and
   a first member configured to support a mask and to fix an edge portion of the work item to prevent the edge portion of the work item from bending due to the force.

14. The apparatus of claim 13, further comprising a second member disposed to prevent the jig from fixing the edge portion.

15. The apparatus of claim 13, further comprising an elevator configured to raise the jig.

16. The apparatus of claim 13, wherein the work item is a substrate of a package for an integrated circuit.

17. The apparatus of claim 13, wherein the jig includes holes and wherein the force is a vacuum.

18. The apparatus of claim 13, wherein the mask has openings configured to support an application of a material to the work item to form external electrical connections for the work item.

19. The apparatus of claim 13, wherein the first member has a surface with an end configured to make point contact with the edge portion.

\* \* \* \* \*